(12) United States Patent
Li

(10) Patent No.: US 10,448,523 B2
(45) Date of Patent: Oct. 15, 2019

(54) FLEXIBLE DISPLAY

(71) Applicant: Wuhan China Star Optoelectronics Semiconductor Display Technology Co., Ltd., Wuhan, Hubei (CN)

(72) Inventor: Yun Li, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/764,782

(22) PCT Filed: Feb. 26, 2018

(86) PCT No.: PCT/CN2018/077254
§ 371 (c)(1),
(2) Date: Mar. 29, 2018

(65) Prior Publication Data
US 2019/0269023 A1  Aug. 29, 2019

(30) Foreign Application Priority Data
Feb. 7, 2018 (CN) .......................... 2018 1 0123925

(51) Int. Cl.
G06F 1/16 (2006.01)
H05K 5/00 (2006.01)
H05K 5/02 (2006.01)

(52) U.S. Cl.
CPC ......... *H05K 5/0017* (2013.01); *H05K 5/0217* (2013.01)

(58) Field of Classification Search
None
See application file for complete search history.

(56) References Cited

U.S. PATENT DOCUMENTS 9,460,643 B2 * 10/2016 Hirakata ............. H01L 51/0097
2010/0064244 A1 * 3/2010 Kilpatrick, II ........ G06F 1/1616
715/773

(Continued)

FOREIGN PATENT DOCUMENTS

CN 1960612 5/2007
CN 201383113 1/2010

(Continued)

*Primary Examiner* — Xanthia C Cunningham
(74) *Attorney, Agent, or Firm* — Leong C. Lei

(57) ABSTRACT

Provided is a flexible display, comprising a flexible display panel, a shell and a support, wherein the flexible display panel comprises a first display part, a bending part and a second display part, the bending part is located between the first display part and the second display part, the shell is attached to a bottom of the flexible display panel, the support comprises a free end and a connecting end, the connecting end is rotatably connected with one end of the shell. After the flexible display panel is bent, the support is located between the first display part and the second display part. The support can serve for supporting and increase the space between the first display part and the second display part to reduce the bent deformation to reduce the stress, to avoid being damaged in the bending process and to extend the service life of the flexible display.

15 Claims, 3 Drawing Sheets

(56) References Cited

U.S. PATENT DOCUMENTS

| | | | | |
|---|---|---|---|---|
| 2010/0066643 | A1* | 3/2010 | King | G06F 1/1616 345/1.3 |
| 2011/0148797 | A1* | 6/2011 | Huitema | G06F 1/1615 345/173 |
| 2011/0188189 | A1* | 8/2011 | Park | G05B 11/01 361/679.05 |
| 2011/0241998 | A1* | 10/2011 | McKinney | G06F 1/1616 345/168 |
| 2012/0139815 | A1* | 6/2012 | Aono | G06F 1/1616 345/1.3 |
| 2013/0120912 | A1* | 5/2013 | Ladouceur | H04M 1/0268 361/679.01 |
| 2016/0014914 | A1* | 1/2016 | Stroetmann | G06F 1/1616 312/223.1 |
| 2017/0060188 | A1* | 3/2017 | Han | G06F 1/1652 |
| 2017/0075389 | A1* | 3/2017 | Yeom | G06F 1/1652 |
| 2017/0142847 | A1* | 5/2017 | Park | H05K 5/0017 |
| 2017/0295654 | A1* | 10/2017 | Choi | H05K 5/0017 |

FOREIGN PATENT DOCUMENTS

| | | |
|---|---|---|
| JP | 2003-298700 | 10/2003 |
| JP | 2006-174506 | 6/2006 |

* cited by examiner

US 10,448,523 B2

FLEXIBLE DISPLAY

RELATED APPLICATIONS

The present application is a National Phase of International Application Number PCT/CN2018/077254, filed Feb. 26, 2018, and claims the priority of China Application 201810123925.3, filed Feb. 7, 2018.

FIELD OF THE INVENTION

The present invention relates to a flexible display field, and more particularly to a flexible display.

BACKGROUND OF THE INVENTION

The flexible display is a flexible display device made of a flexible material, which has the advantages of thin thickness, small size, light weight, easy carrying, bendability, energy-saving, environmental protection, personality and fashion. Therefore, the flexible display will be rapidly developed in the field of display technology. However, during the bending process, the circuit in the bending area of the flexible display may be damaged, thus reducing the service life of the circuit in the bending area, causing the open circuit in the bending area and affecting the display effect of the entire flexible panel. At present, the bending angle of a common flexible display is too small. The bending area can be easily damaged during bending and the service life of the entire flexible display may be shortened.

SUMMARY OF THE INVENTION

In order to solve the deficiencies of prior art, the present invention provides a flexible display, capable of reducing the stress of the bending part, avoiding the bending part being damaged in the bending process, and extending the service life of the flexible display.

The present invention provides a flexible display, comprising a flexible display panel, a shell and a support, wherein the flexible display panel comprises a first display part, a bending part and a second display part, the bending part is located between the first display part and the second display part, the shell is attached to a bottom of the flexible display panel, the support comprises a free end and a connecting end, the connecting end is rotatably connected with one end of the shell.

Furthermore, the support has a first state of being in contact with a top of the second display part and the support has a plate shape, and as the support is in the first state, the free end is located between the first display part and the second display part.

Furthermore, an end surface of the free end is an arc surface.

Furthermore, the shell comprises a first shell body and a second shell body, the first shell body is attached to a bottom of the first display part, the second shell body is attached to a bottom of the second display part, the connecting end is rotatably connected to an end of the second shell body away from the bending part, a space between the first shell body and the second shell body is equal to a length of the bending part in a first direction.

Furthermore, a length of the free end in a second direction is larger than a length of the connecting end in the second direction and the second direction is perpendicular to the first direction.

Furthermore, a length of one end of the first shell body and one end of the second shell body close to the bending part in the second direction is smaller than a length of one end of the first shell body and one end of the second shell body away from the bending part in the second direction.

Furthermore, a sum of the length of the one end of the first shell body away from the bending part, the length of the connecting end and the length of the one end of the second shell body away from the bending part is equal to a sum of the length of the one end of the first shell body close to the bending part, the length of the free end and the length of the one end of the second shell body close to the bending part.

Furthermore, the shell further comprises a first supporting component and a second supporting component, the first supporting component is located at one end of the first shell body close to the bending part and the second supporting component is located at one end of the second shell body close to the bending part.

Furthermore, the support further has a second state forming an acute angle with the second display part.

Furthermore, the flexible display further comprises a connecting component, one end of the connecting component is connected with one end of the shell, the other end of the connecting component is connected with the connecting end and the support rotates around the connecting component.

The present invention provides a flexible display, comprising a flexible display panel, a shell and a support, wherein the flexible display panel comprises a first display part, a bending part and a second display part, the connecting end is rotatably connected with one end of the shell, the support has a first state of being in contact with a top of the second display part, and as the support is in the first state and after the flexible display panel is bent, the support is located between the first display part and the second display part. The support can serve for supporting on one hand and can increase the space between the first display part and the second display part on the other hand to reduce the bent deformation to reduce the stress of the bending part, to avoid the bending part being damaged in the bending process and to extend the service life of the flexible display.

DETAILED DESCRIPTION OF PREFERRED EMBODIMENTS

Figure 1:
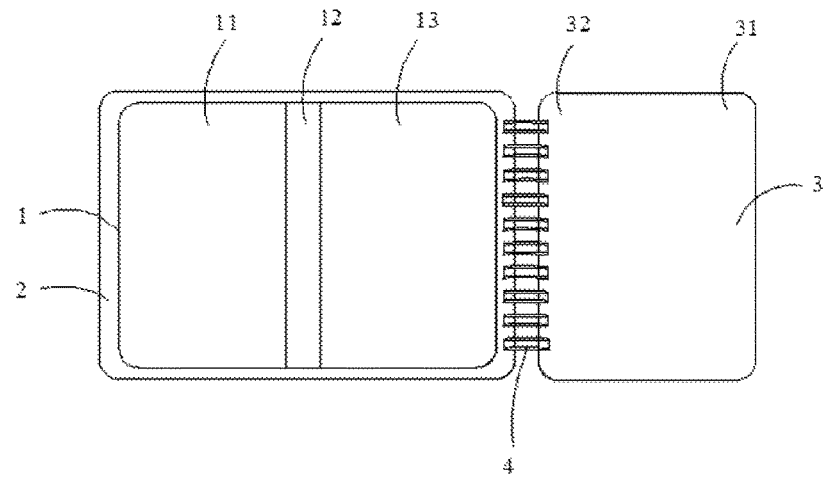
FIG. 1 is a structure diagram of the flexible display of the first embodiment in an open state.

Hereinafter, the embodiments of the present invention will be described in detail with reference to the accompanying drawings. However, the present invention may be embodied in various different forms and should not be construed as limited to the specific embodiments set forth herein. Rather, these embodiments are provided to explain the principles of the present invention and the practical application thereof to thereby enable those of ordinary skill in the art to understand the various embodiments of the present invention and the various adaptations for the specific intended application. In the drawings, the same reference numerals will be used to refer to the same elements throughout.

Embodiment 1

As referring to FIG. 1 to FIG. 4, the flexible display of the embodiment comprises a flexible display panel 1, a shell 2 and a support 3. The flexible display panel 1 comprises a first display part 11, a bending part 12 and a second display part 13. The bending part 12 is located between the first display part 11 and the second display part 13. The shell 2 is attached to a bottom of the flexible display panel 1. The support 3 comprises a free end 31 and a connecting end 32. The connecting end 32 is rotatably connected with one end of the shell 2.

Figure 2:
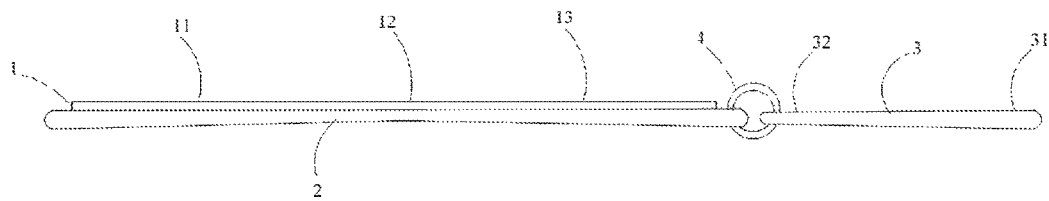
FIG. 2 is a sectional diagram of FIG. 1.
Figure 3:
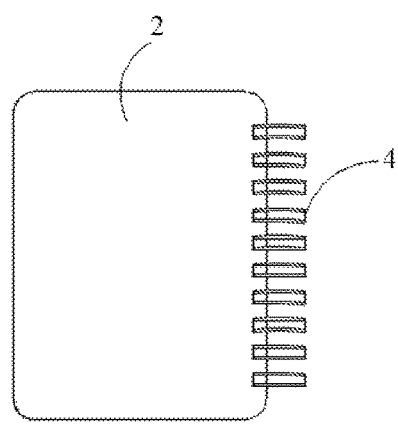
FIG. 3 is a structure diagram of the flexible display of the first embodiment in a folded state.
Figure 4:
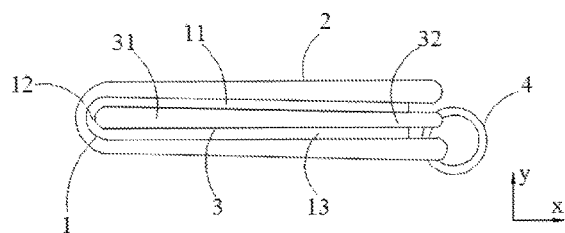
FIG. 4 is a sectional diagram of FIG. 3.

The flexible display in this embodiment has an open state and a folded state as respectively shown in FIG. 1 and FIG. 2. As the flexible display is in the open state, the first display part 11, the bending part 12 and the second display part 13 are located on the same plane. The first display part 11, the bending part 12 and the second display part 13 form an integral display surface for displaying an image of the flexible display. As shown in FIG. 3 and FIG. 4, as the flexible display is in the folded state, the flexible display panel 1 is bent at the bending part 12 such that the first display part 11 is located above the second display part 13. Then, the support 3 is located between the first display part 11 and the second display part 13. The bending part 12 is located on the side of the first display part 11 and the second display part 13. The support 3 can serve for supporting the first display part 11 on one hand and can increase the space between the first display part 11 and the second display part 13 on the other hand to reduce the bent deformation of the bending part 12 to reduce the stress of the bending part 12, to avoid the bending part 12 being damaged in the bending process and to extend the service life of the flexible display.

The support 3 has a first state of being in contact with a top of the second display part 13. As the flexible display is in the folded state, the support 3 is in the first state. Preferably, the support 3 has a plate shape. As the support 3 is in the first state, the free end 31 is located between the first display part 11 and the second display part 13. Namely, as the support 3 is in the first state, the end portion of the free end 31 exceeds the end portion of the second display part 13 close to the bending part 12 in the first direction. Then, as the flexible display is in the folded state, the support 3 can make the first display part 11 be stressed more evenly. The first direction is the x direction in FIG. 4.

An end surface of the free end 31 is an arc surface. Here, the end surface of the free end 31 refers to the end surface of the free end 31 right facing the connecting end 32 and away from the connecting end 32. During the bending process of the bending part 12, the bending part has a certain degree of arc. The end surface of the free end 31 is configured to be an arc surface such that the end surface of the free end 31 can be better attached to the bending part 12 to serve the functions of transition and support for the bending part 12.

A length of the free end 31 in a second direction is larger than a length of the connecting end 32 in the second direction and the second direction is perpendicular to the first direction. Namely, a thickness of the free end 31 is larger than a thickness of the connecting end 32. The second direction is the y direction in FIG. 4, i.e. the direction perpendicular to a direction of the second display part 13.

In this embodiment, a thickness of the support 3 is smaller than a width of the bending part 12. The thickness of the support 3 refers to the length of the support 3 in the second direction (y direction). A width of the bending part 12 refers to the length of the bending part 12 in the first direction (x direction) as the flexible display is in the open state. Accordingly, it can reduce the stress of the support 3 to the bending part 12 to avoid the bending part 12 being damaged in the bending process of the flexible display panel 1 and to extend the service life of the flexible display.

A length of a middle region of the shell 2 in the second direction (y direction) is smaller than a length of an edge region of the shell 2 in the second direction (y direction). Namely, a thickness of the middle region of the shell 2 is smaller than a thickness of the edge region of the shell 2. The shell 2 is a thin plate-shaped structure with a thin middle and two thick ends. A material of the shell 2 in this embodiment is also an elastic material.

As the flexible display is in the folded state, a sum of the thickness of the middle regions of the shell 2 at the top and bottom of the support 3 and the thickness of the free end 31 is equal to a sum of the thickness of the edge regions of the shell 2 at the top and bottom of the support 3 and the thickness of the connecting end 32. Then, the entire thickness can be ensured to be consistent after the flexible display is folded.

The flexible display further comprises a connecting component 4. One end of the connecting component 4 is connected with one end of the shell 2. The other end of the connecting component 4 is connected with the connecting end 32. The support 3 rotates around the connecting component 4. Preferably, the connecting component 4 is a snap ring and a material of the snap ring is metal. Certainly, there is no limitation here for the connecting component. The connecting component 4 may also be other components that can rotatably connect the support 3 and the shell 2.

Figure 5:
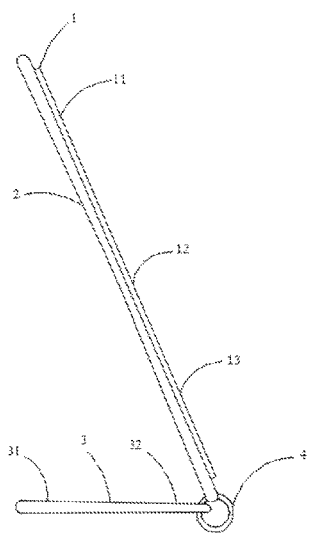
FIG. 5 is another structure diagram of the flexible display.

Please refer to FIG. 5. As the connecting component 4 is a snap ring, the support 3 further has a second state forming an acute angle with the second display part 13. Specifically, the snap ring is provided with two bayonets (not shown), the two bayonets are used for limiting the shell 2 and the support 3 respectively, so that the support 3 and the second display part 13 form an acute angle. Then, the flexible display panel 1 can be used as a flat panel, the shell 2 can be used for supporting the entire flexible display panel 1 and the support 3 can be used for fixing the shell 2. Preferably, the acute angle between the support 3 and the second display part 13 is 60 degrees, thus for meeting the user's reading habits and reducing the user's eye fatigue.

In addition, the support 3 in this embodiment can be detachably replaced with components having different functions. For instance, the support 3 can be an electronic drawing board, on which the user can use an electronic pen to draw. Alternatively, the support 3 can also be a paper notebook, on which the user can write notes for reading.

Certainly, in the present embodiment, as regarding a flexible display panel 1 with a large size, the flexible display panel 1 may include a plurality of bending parts and a plurality of display parts for the convenient storage or carrying. A thickness of the part of the shell 2 corresponding to the plurality of bending parts is thinner. Both the flexible display panel 1 and the shell 2 are spiral after being folded. The support 3 is covered in the middle of the flexible display panel 1 and the shell 2.

Embodiment 2

The difference between the present embodiment and the first embodiment is that the structures of the shells 2 are different.

Figure 6:
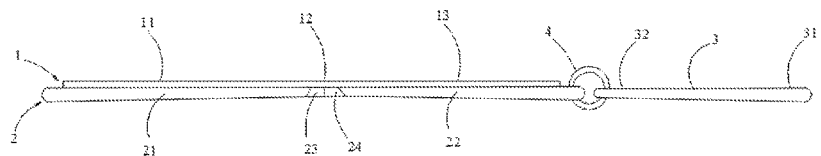
FIG. 6 is a structure diagram of the flexible display of the second embodiment in an open state.
Figure 7:
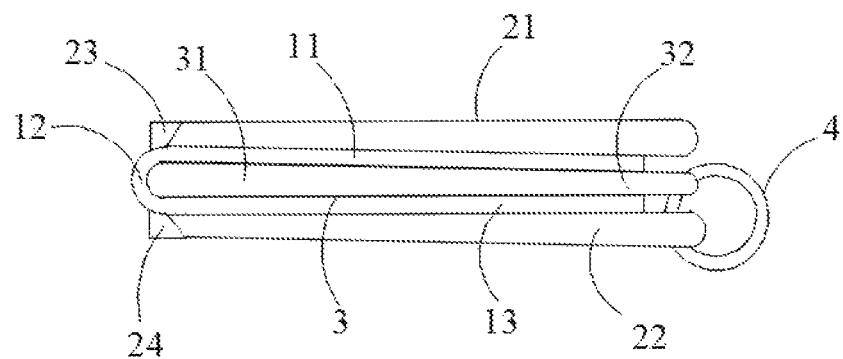
FIG. 7 is a structure diagram of the flexible display of the second embodiment in a folded state.

Specifically, referring to FIG. 6 and FIG. 7, the shell 2 comprises a first shell body 21 and a second shell body 22. The first shell body 21 is attached to a bottom of the first display part 11. The second shell body 22 is attached to a bottom of the second display part 13. The connecting end 32 is rotatably connected with an end of the second shell body 22 away from the bending part 12. A space between the first shell body 21 and the second shell body 22 is equal to a length of the bending part 12 in a first direction (x direction), i.e. the direction that the second shell body 22 is perpendicular to the end of the bending part 12.

A length of one end of the first shell body 21 and one end of the second shell body 22 close to the bending part 12 in the second direction (y direction) is smaller than a length of one end of the first shell body 21 and one end of the second shell body 22 away from the bending part 12 in the second direction (y direction). Namely, a thickness of one end of the first shell body 21 and one end of the second shell body 22 close to the bending part 12 is smaller than a thickness of one end of the first shell body 21 and one end of the second shell body 22 away from the bending part 12. Thus, a thickness of the middle region of the shell 2 is smaller than a thickness of the edge region of the shell 2.

A sum of the length of the one end of the first shell body 21 away from the bending part 12, the length of the connecting end 32 and the length of the one end of the second shell body 22 away from the bending part 12 in the second direction (y direction) is equal to a sum of the length of the one end of the first shell body 21 close to the bending part 12, the length of the free end 31 and the length of the one end of the second shell body 22 close to the bending part 12 in the second direction (y direction). Namely, a sum of the thickness of the one end of the first shell body 21 away from the bending part 12, the thickness of the connecting end 32 and the thickness of the one end of the second shell body 22 away from the bending part 12 is equal to a sum of the thickness of the one end of the first shell body 21 close to the bending part 12, the thickness of the free end 31 and the thickness of the one end of the second shell body 22 close to the bending part 12. Then, the entire thickness can be ensured to be consistent after the flexible display is folded. One end of the connecting component 4 is connected with one end of the second shell body 22.

Besides, the shell 2 in this embodiment further comprises a first supporting component 23 and a second supporting component 24. The first supporting component 23 is located at one end of the first shell body 21 close to the bending part 12 and the second supporting component 24 is located at one end of the second shell body 22 close to the bending part 12.

Figure 8:
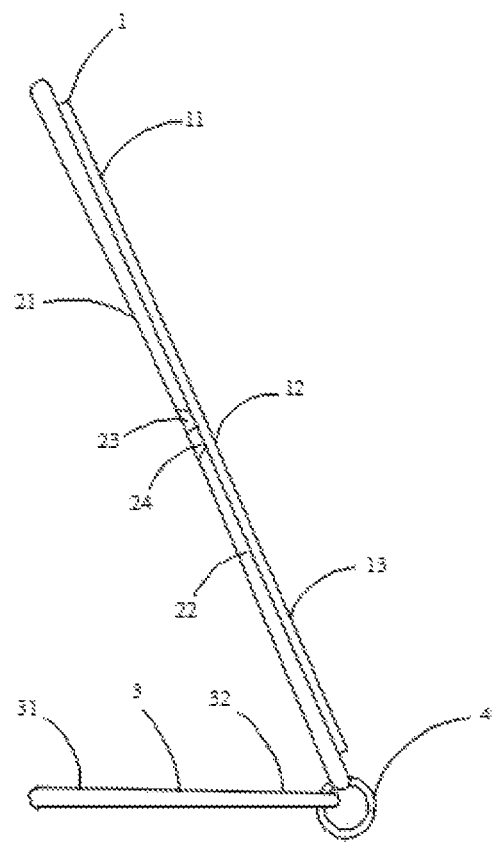
FIG. 8 is another structure diagram of the flexible display of the second embodiment.

Please refer to FIG. 8. As the support 3 is in the second state, i.e. the support 3 and the second display part 13 form an acute angle, the flexible display panel 1 can be used to be a flat panel. Then, the first supporting component 23 and the second supporting component 24 are located between the first shell body 21 and the second shell body 22 and the first supporting component 23 abuts the second supporting component 24. The first shell body 21 is used to support the first display part 11. The second shell body 22 is used to support the second display part 13. The first supporting component 23 and the second supporting component 24 are engaged between the first shell body 21 and the second shell body 22 and are used to support the bending part 12.

Please refer to FIG. 7, again. As the flexible display is in the folded state, the support 3 is in the first state. The flexible display panel 1 is bent at the position of the bending part 12 such that the first display part 11 is located above the second display part 13. The first supporting component 23 and the second supporting component 24 are separated from each other. The first supporting component 23 and the first shell body 21 are located above the bending part 12. The second supporting component 24 and the second shell body 22 are located under the bending part 12.

Since the first shell body 21 and the second shell body 22 are spaced apart from each other, the shell 2 does not squeeze the bending part 12 during the bending process of the flexible display to reduce the stress suffered by the bending part 12, to avoid the bending part 12 being damaged in the bending process and to extend the service life of the flexible display.

Certainly, in the present embodiment, as regarding a flexible display panel 1 with a large size, the flexible display panel 1 may include a plurality of bending parts and a plurality of display parts for the convenient storage or carrying. The shell 2 can comprise a plurality of shell bodies and a plurality of supporting components. The flexible display panel 1 is spiral after being folded. A layer of display part is sandwiched between every two adjacent shell bodies, i.e. the plurality of shell bodies and the plurality of display parts are alternately arranged in the second direction (y direction). The support 3 is in the middle of the plurality of shell bodies and the plurality of supporting components.

Above are only specific embodiments of the present application, the scope of the present application is not limited to this, and to any persons who are skilled in the art, change or replacement which is easily derived should be covered by the protected scope of the application. Thus, the protected scope of the application should go by the subject claims.

What is claimed is:

1. A flexible display, comprising a flexible display panel, a shell and a support, wherein the flexible display panel comprises a first display part, a bending part and a second display part, the bending part is located between the first display part and the second display part, the shell is attached to a bottom of the flexible display panel, the support comprises a free end and a connecting end, the connecting end is rotatably connected with one end of the shell, wherein the support has a first state of being in contact with a top of the second display part and the support has a plate shape, and as the support is in the first state, the free end is located between the first display part and the second display part, an end surface of the free end is an arc surface, the shell comprises a first shell body and a second shell body, the first shell body is attached with a bottom of the first display part, the second shell body is attached with a bottom of the second display part, the connecting end is rotatably connected with an end of the second shell body away from the bending part, a space between the first shell body and the second shell body is equal to a length of the bending part in a first direction.

2. The flexible display according to claim 1, wherein a length of the free end in a second direction is larger than a length of the connecting end in the second direction and the second direction is perpendicular to the first direction.

3. The flexible display according to claim 2, wherein a length of one end of the first shell body and one end of the second shell body close to the bending part in the second direction is smaller than a length of one end of the first shell body and one end of the second shell body away from the bending part in the second direction.

4. The flexible display according to claim 2, wherein the flexible display further comprises a connecting component, one end of the connecting component is connected with one end of the shell, the other end of the connecting component is connected with the connecting end of the support, and the support rotates around the connecting component.

5. The flexible display according to claim 3, wherein a sum of the length of the one end of the first shell body away from the bending part, the length of the connecting end and the length of the one end of the second shell body away from the bending part is equal to a sum of the length of the one end of the first shell body close to the bending part, the length of the free end and the length of the one end of the second shell body close to the bending part.

6. The flexible display according to claim 3, wherein the flexible display further comprises a connecting component, one end of the connecting component is connected with one end of the shell, the other end of the connecting component is connected with the connecting end of the support, and the support rotates around the connecting component.

7. The flexible display according to claim 5, wherein the flexible display further comprises a connecting component, one end of the connecting component is connected with one end of the shell, the other end of the connecting component is connected with the connecting end of the support, and the support rotates around the connecting component.

8. The flexible display according to claim 1, wherein the shell further comprises a first supporting component and a second supporting component, the first supporting component is located at one end of the first shell body close to the bending part and the second supporting component is located at one end of the second shell body close to the bending part.

9. The flexible display according to claim 8, wherein the flexible display further comprises a connecting component, one end of the connecting component is connected with one end of the shell, the other end of the connecting component is connected with the connecting end of the support, and the support rotates around the connecting component.

10. The flexible display according to claim 1, wherein the support further has a second state forming an acute angle with the second display part.

11. The flexible display according to claim 10, wherein the flexible display further comprises a connecting component, one end of the connecting component is connected with one end of the shell, the other end of the connecting component is connected with the connecting end of the support, and the support rotates around the connecting component.

12. The flexible display according to claim 1, wherein the flexible display further comprises a connecting component, one end of the connecting component is connected with one end of the shell, the other end of the connecting component is connected with the connecting end of the support, and the support rotates around the connecting component.

13. The flexible display according to claim 1, wherein the flexible display further comprises a connecting component, one end of the connecting component is connected with one end of the shell, the other end of the connecting component is connected with the connecting end of the support, and the support rotates around the connecting component.

14. The flexible display according to claim 1, wherein the flexible display further comprises a connecting component, one end of the connecting component is connected with one end of the shell, the other end of the connecting component is connected with the connecting end of the support, and the support rotates around the connecting component.

15. The flexible display according to claim 1, wherein the flexible display further comprises a connecting component, one end of the connecting component is connected with one end of the shell, the other end of the connecting component is connected with the connecting end of the support, and the support rotates around the connecting component.

* * * * *